(12) United States Patent
Huseinovic et al.

(10) Patent No.: US 9,129,778 B2
(45) Date of Patent: Sep. 8, 2015

(54) FLUID DISTRIBUTION MEMBERS AND/OR ASSEMBLIES

(75) Inventors: Armin Huseinovic, Medford, MA (US); Ivan L. Berry, Amesbury, MA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 435 days.

(21) Appl. No.: 13/051,713

(22) Filed: Mar. 18, 2011

(65) Prior Publication Data

US 2012/0237696 A1    Sep. 20, 2012

(51) Int. Cl.
*H01J 37/32* (2006.01)
*C23C 16/452* (2006.01)
*C23C 16/455* (2006.01)

(52) U.S. Cl.
CPC ......... *H01J 37/3244* (2013.01); *C23C 16/4558* (2013.01); *C23C 16/45565* (2013.01); *H01J 37/32633* (2013.01); *C23C 16/452* (2013.01); *H01J 37/32192* (2013.01); *H01J 37/32357* (2013.01)

(58) Field of Classification Search
CPC .. C23C 16/452; C23C 16/455; C23C 16/507; C23C 16/511; C23C 16/45563; C23C 16/45565–16/4558; C23C 16/45568; C23C 16/45574; F27B 17/0025; H01J 37/32192; H01J 37/32357; H01J 37/3244; H01J 37/32449; H01J 21/67069; H01L 21/31116; H01L 21/67069; H01L 21/02337; H01L 21/3065; Y10S 156/914; B05B 1/18; C30B 25/14

USPC ............ 118/73, 715, 720, 723 MW, 732 MR, 118/732 ER, 723 IR; 156/345.1, 345.17, 156/345.21, 345.33, 345.34, 345.36, 345.41
See application file for complete search history.

(56) References Cited

U.S. PATENT DOCUMENTS

| | | | | |
|---|---|---|---|---|
| 2,835,355 | A | * | 5/1958 | Armstrong .............. 188/218 XL |
| 3,141,739 | A | | 7/1964 | Lewis et al. |
| 3,584,177 | A | | 6/1971 | Bucksbaum |
| 3,593,053 | A | * | 7/1971 | Mueller ........................ 313/458 |
| 3,819,900 | A | | 6/1974 | Ironfield |
| 3,872,349 | A | | 3/1975 | Spero et al. |
| 3,882,352 | A | | 5/1975 | Osepchuk et al. |
| 4,137,441 | A | | 1/1979 | Bucksbaum |
| 4,137,442 | A | | 1/1979 | Tateda |

(Continued)

FOREIGN PATENT DOCUMENTS

| | | | |
|---|---|---|---|
| EP | 0131433 | A2 | 1/1985 |
| EP | 0196214 | A2 | 10/1986 |

(Continued)

OTHER PUBLICATIONS

W. D. Kingery, "Factors Affecting Thermal Stress Resistance of Ceramic Materials," J. Am. Ceram. Soc., vol. 38, No. 1, pp. 3-15 (1955), The American Ceramic Society.*

(Continued)

*Primary Examiner* — Jeffrie R Lund
*Assistant Examiner* — Stanislav Antolin

(57) ABSTRACT

A fluid distribution member assembly for use in a substrate processing system includes a fluid distribution member having a central portion and a perimeter portion. The fluid distribution member defines at least one slot formed there-through and the at least one slot extends along a non-radial path configured to allow the central portion to expand and rotate with respect to the perimeter portion.

22 Claims, 17 Drawing Sheets

(56) References Cited

U.S. PATENT DOCUMENTS

| | | | |
|---|---|---|---|
| 4,207,452 A | 6/1980 | Arai | |
| 4,311,899 A * | 1/1982 | Goessler | 219/451.1 |
| 4,341,592 A | 7/1982 | Shortes et al. | |
| 4,511,779 A | 4/1985 | Bucksbaum et al. | |
| RE32,664 E | 5/1988 | Osepchuk et al. | |
| 4,773,355 A | 9/1988 | Reif et al. | |
| 4,776,923 A | 10/1988 | Spencer et al. | |
| 4,792,378 A | 12/1988 | Rose et al. | |
| 5,024,716 A * | 6/1991 | Sato | 156/345.42 |
| 5,024,748 A | 6/1991 | Fujimura | |
| 5,063,329 A | 11/1991 | Okamoto | |
| 5,082,517 A | 1/1992 | Moslehi | |
| 5,179,363 A * | 1/1993 | Schwartz et al. | 333/229 |
| 5,180,467 A | 1/1993 | Cook et al. | |
| 5,262,610 A | 11/1993 | Huang et al. | |
| 5,338,363 A | 8/1994 | Kawata et al. | |
| 5,356,673 A | 10/1994 | Schmitt et al. | |
| 5,366,557 A | 11/1994 | Yu | |
| 5,423,936 A | 6/1995 | Tomita et al. | |
| 5,447,570 A | 9/1995 | Schmitz et al. | |
| 5,498,308 A | 3/1996 | Kamarehi et al. | |
| 5,500,256 A * | 3/1996 | Watabe | 427/579 |
| 5,552,017 A | 9/1996 | Jang et al. | |
| 5,555,788 A * | 9/1996 | Gakhar et al. | 83/835 |
| 5,589,002 A | 12/1996 | Su | |
| 5,593,540 A | 1/1997 | Tomita et al. | |
| 5,595,606 A | 1/1997 | Fujikawa et al. | |
| 5,614,026 A * | 3/1997 | Williams | 118/723 ME |
| 5,746,875 A | 5/1998 | Maydan et al. | |
| 5,783,492 A | 7/1998 | Higuchi et al. | |
| 5,844,195 A | 12/1998 | Fairbairn et al. | |
| 5,919,332 A | 7/1999 | Koshiishi et al. | |
| 5,928,426 A | 7/1999 | Aitchison | |
| 5,961,851 A | 10/1999 | Kamarehi et al. | |
| 5,965,034 A | 10/1999 | Vinogradov et al. | |
| 5,968,275 A | 10/1999 | Lee et al. | |
| 5,980,240 A * | 11/1999 | Krautzig et al. | 431/285 |
| 5,985,007 A | 11/1999 | Carrea et al. | |
| 5,985,033 A | 11/1999 | Yudovsky et al. | |
| 5,986,747 A | 11/1999 | Moran | |
| 5,994,678 A | 11/1999 | Zhao et al. | |
| 6,007,635 A | 12/1999 | Mahawili | |
| 6,010,748 A | 1/2000 | Van Buskirk et al. | |
| 6,027,604 A | 2/2000 | Lim et al. | |
| 6,036,782 A | 3/2000 | Tanaka et al. | |
| 6,041,733 A | 3/2000 | Kim et al. | |
| 6,045,618 A | 4/2000 | Raoux et al. | |
| 6,050,216 A | 4/2000 | Szapucki et al. | |
| 6,053,982 A | 4/2000 | Halpin et al. | |
| 6,057,645 A | 5/2000 | Srivastava et al. | |
| 6,082,374 A | 7/2000 | Huffman et al. | |
| 6,090,210 A | 7/2000 | Ballance et al. | |
| 6,101,970 A * | 8/2000 | Koshimizu | 118/723 E |
| 6,106,625 A | 8/2000 | Koai et al. | |
| 6,123,775 A | 9/2000 | Hao et al. | |
| 6,123,791 A | 9/2000 | Han et al. | |
| 6,176,969 B1 | 1/2001 | Park et al. | |
| 6,182,603 B1 | 2/2001 | Shang et al. | |
| 6,190,507 B1 | 2/2001 | Whealton et al. | |
| 6,190,732 B1 | 2/2001 | Omstead et al. | |
| 6,193,802 B1 | 2/2001 | Pang et al. | |
| 6,194,628 B1 | 2/2001 | Pang et al. | |
| 6,203,621 B1 * | 3/2001 | Tran et al. | 118/728 |
| 6,255,222 B1 | 7/2001 | Xia et al. | |
| 6,264,852 B1 * | 7/2001 | Herchen et al. | 216/60 |
| 6,281,135 B1 | 8/2001 | Han et al. | |
| 6,325,018 B1 * | 12/2001 | Hongoh | 118/723 AN |
| 6,343,565 B1 * | 2/2002 | Hongoh | 118/723 MW |
| 6,352,050 B2 | 3/2002 | Kamarehi et al. | |
| 6,366,346 B1 | 4/2002 | Nowak et al. | |
| 6,367,412 B1 | 4/2002 | Ramaswamy et al. | |
| 6,368,567 B2 | 4/2002 | Comita et al. | |
| 6,382,249 B1 * | 5/2002 | Kawasaki et al. | 137/565.3 |
| 6,391,146 B1 | 5/2002 | Bhatnagar et al. | |
| 6,415,736 B1 | 7/2002 | Hao et al. | |
| 6,422,002 B1 | 7/2002 | Whealton et al. | |
| 6,444,039 B1 | 9/2002 | Nguyen | |
| 6,444,040 B1 * | 9/2002 | Herchen et al. | 118/715 |
| 6,471,822 B1 | 10/2002 | Yin et al. | |
| 6,492,186 B1 | 12/2002 | Han et al. | |
| 6,503,330 B1 | 1/2003 | Sneh et al. | |
| 6,532,339 B1 * | 3/2003 | Edgar et al. | 392/490 |
| 6,537,419 B1 | 3/2003 | Kinnard | |
| 6,538,734 B2 | 3/2003 | Powell | |
| 6,548,416 B2 | 4/2003 | Han et al. | |
| 6,565,661 B1 | 5/2003 | Nguyen | |
| 6,592,817 B1 | 7/2003 | Tsai et al. | |
| 6,599,367 B1 | 7/2003 | Nakatsuka | |
| 6,633,391 B1 | 10/2003 | Oluseyi et al. | |
| 6,635,117 B1 | 10/2003 | Kinnard et al. | |
| 6,651,912 B2 * | 11/2003 | Gulati et al. | 239/553 |
| 6,682,630 B1 * | 1/2004 | Colpo et al. | 156/345.48 |
| 6,692,649 B2 | 2/2004 | Collison et al. | |
| 6,727,654 B2 * | 4/2004 | Ogawa et al. | 315/111.01 |
| 6,761,796 B2 | 7/2004 | Srivastava et al. | |
| 6,782,843 B2 | 8/2004 | Kinnard et al. | |
| 6,783,627 B1 | 8/2004 | Mahawili | |
| 6,849,559 B2 | 2/2005 | Balasubramaniam et al. | |
| 6,905,079 B2 | 6/2005 | Kuwada et al. | |
| 6,942,753 B2 | 9/2005 | Choi et al. | |
| 6,946,054 B2 | 9/2005 | Brcka | |
| 7,037,846 B2 | 5/2006 | Srivastava et al. | |
| 7,228,645 B2 | 6/2007 | Pham | |
| 7,461,614 B2 | 12/2008 | Fink et al. | |
| 7,540,923 B2 | 6/2009 | Takagi et al. | |
| 7,552,521 B2 | 6/2009 | Fink | |
| 7,581,511 B2 * | 9/2009 | Mardian et al. | 118/723 MW |
| 7,601,242 B2 | 10/2009 | Fink | |
| 7,615,251 B2 | 11/2009 | Kakimoto et al. | |
| 7,779,784 B2 | 8/2010 | Chen et al. | |
| 7,799,134 B2 | 9/2010 | Tsuji et al. | |
| 7,811,409 B2 | 10/2010 | Egley et al. | |
| 7,819,082 B2 | 10/2010 | Ohmi et al. | |
| 7,886,687 B2 | 2/2011 | Lee et al. | |
| 8,268,181 B2 | 9/2012 | Srivastava et al. | |
| 8,580,076 B2 | 11/2013 | Becknell et al. | |
| 2001/0006093 A1 * | 7/2001 | Tabuchi et al. | 156/345 |
| 2001/0016674 A1 | 8/2001 | Pang et al. | |
| 2002/0066535 A1 | 6/2002 | Brown et al. | |
| 2002/0088542 A1 | 7/2002 | Nishikawa et al. | |
| 2002/0144706 A1 | 10/2002 | Davis et al. | |
| 2002/0144785 A1 | 10/2002 | Srivastava et al. | |
| 2003/0010452 A1 | 1/2003 | Park et al. | |
| 2003/0012624 A1 | 1/2003 | Kinnard et al. | |
| 2003/0022511 A1 | 1/2003 | Han et al. | |
| 2003/0032300 A1 | 2/2003 | Waldfried et al. | |
| 2003/0094134 A1 | 5/2003 | Minami | |
| 2003/0143328 A1 | 7/2003 | Chen et al. | |
| 2003/0194876 A1 | 10/2003 | Balasubramaniam et al. | |
| 2003/0205328 A1 | 11/2003 | Kinnard et al. | |
| 2004/0056602 A1 | 3/2004 | Yang et al. | |
| 2004/0084412 A1 | 5/2004 | Waldfried et al. | |
| 2004/0129211 A1 | 7/2004 | Blonigan et al. | |
| 2004/0140053 A1 | 7/2004 | Srivastava et al. | |
| 2004/0144489 A1 | 7/2004 | Satoh et al. | |
| 2004/0149223 A1 | 8/2004 | Collison et al. | |
| 2004/0150012 A1 | 8/2004 | Jin et al. | |
| 2004/0152296 A1 | 8/2004 | Matz et al. | |
| 2004/0206305 A1 | 10/2004 | Choi et al. | |
| 2004/0229449 A1 | 11/2004 | Biberger et al. | |
| 2004/0235299 A1 | 11/2004 | Srivastava et al. | |
| 2004/0238123 A1 * | 12/2004 | Becknell et al. | 156/345.33 |
| 2005/0000943 A1 * | 1/2005 | Sugaya et al. | 216/90 |
| 2005/0014361 A1 | 1/2005 | Nguyen et al. | |
| 2005/0022839 A1 | 2/2005 | Savas et al. | |
| 2005/0079717 A1 | 4/2005 | Savas et al. | |
| 2005/0126487 A1 * | 6/2005 | Tabuchi et al. | 118/723 E |
| 2005/0241767 A1 * | 11/2005 | Ferris et al. | 156/345.35 |
| 2005/0258280 A1 | 11/2005 | Goto et al. | |
| 2005/0263170 A1 | 12/2005 | Tannous et al. | |
| 2007/0131544 A1 * | 6/2007 | Brcka et al. | 204/298.11 |
| 2008/0078744 A1 * | 4/2008 | Wang et al. | 216/67 |
| 2008/0130089 A1 * | 6/2008 | Miles | 359/290 |
| 2008/0185104 A1 * | 8/2008 | Brcka | 156/345.29 |

(56) References Cited

U.S. PATENT DOCUMENTS

| | | |
|---|---|---|
| 2009/0095222 A1* | 4/2009 | Tam et al. ............... 118/723 R |
| 2009/0209113 A1* | 8/2009 | Murata et al. ............... 438/795 |
| 2009/0286405 A1 | 11/2009 | Okesaku et al. |
| 2010/0055807 A1 | 3/2010 | Srivastava et al. |
| 2010/0230051 A1 | 9/2010 | Iizuka |
| 2011/0136346 A1 | 6/2011 | Geissbuhler et al. |
| 2011/0253310 A1* | 10/2011 | Benjamin ............... 156/345.1 |

FOREIGN PATENT DOCUMENTS

| | | | |
|---|---|---|---|
| EP | 0702392 A2 | 3/1996 | |
| EP | 1150331 A2 | 10/2001 | |
| JP | 2001-226775 | 8/2001 | |
| JP | 2001226775 A * | 8/2001 | ............ C23C 16/509 |
| WO | WO-97/37055 A1 | 10/1997 | |
| WO | WO-0020655 A1 | 4/2000 | |
| WO | WO-03007326 A2 | 1/2003 | |
| WO | WO2006/107114 | 10/2006 | |

OTHER PUBLICATIONS

E. J. Hearn, Mechanics of Materials, vol. 2—An Introduction to the Mechanics of Elastic and Plastic Deformation of Solids and Structural Materials (3rd Edition), Elsevier (1997), pp. 117-140. Online version available at: http://www.knovel.com/web/portal/browse/display?_EXT_KNOVEL_DISPLAY_bookid=434&VerticalID=0.*

D. J. Buchanan, "Stress-Relief Simulation" in D. U. Furrer & S. L. Semiatin, Editors, ASM Handbook, vol. 22B—Metals Process Simulation, ASM International (2010), pp. 652-630. Online version available at: http://www.knovel.com/web/portal/browse/display?_$_L$ $_{EXT}$_KNOVEL_DISPLAY_bookid=3670&VerticalID=0.*

* cited by examiner

FLUID DISTRIBUTION MEMBERS AND/OR ASSEMBLIES

BACKGROUND

The present invention is generally directed to fluid distribution member assemblies for use in plasma processing apparatuses, and more particularly, to mitigating the effects of thermal stress on fluid distribution member assemblies during plasma processing.

Currently, Integrated Circuit (IC) development requires driving plasma ashing processes to utilize increasingly aggressive gas chemistry and thermal environments. It is important that the ashing process occur at a uniform rate across the surface of a wafer being processed. To this end, process conditions are precisely controlled and carefully engineered components are used in the processing chamber to insure uniform ashing. One such component is a so-called baffle plate, or fluid distribution plate and/or assemblies designed to uniformly direct and distribute energized plasma onto a wafer surface. One exemplary fluid distribution plate design is shown and described in U.S. Patent Application Publication No. 2005/0241767.

The plasma temperature within dry asher systems is generally in the range of 1000° C. Molecular species are excited within the microwave source of the system and carry energy downstream. Energy is transferred in the form of heat to plasma wetted parts. As a consequence of uneven heat transfer, thermal non-uniformities develop across these parts and give rise to internal stresses which in turn compromise their structural integrity. Surface recombination of species upon collision with various components within the processing system including, in particular, the fluid distribution member, which causes extremely high heat loads, requiring novel thermal management of the design of the plasma processing system including the fluid distribution member.

Glasses, Ceramics and Fused Silica are often employed for the design of parts used in the most critical areas of plasma processing systems, including the fluid distribution member due to their resistance to high temperatures as well as their chemical purity. Stress fracture often occurs in these materials due to uneven thermal loading or differential expansion between dissimilar materials. Uneven heating and cooling can in many cases generate stresses in excess of the material's yield or ultimate tensile stress limit, resulting in catastrophic failure. Although impervious to high temperatures in the general range of plasma processing, these materials are sensitive to substantial temperature gradients and thermal shock.

Fluid distribution members and/or assemblies used in plasma systems may be comprised of alumina ceramic ($AL_2O_3$), Fused silica (SiO2), or other glasses, ceramics, metals, or any suitable materials and/or combinations thereof. Downstream microwave plasma sources, akin to plasma torches, output radicalized gas and cause extreme temperature gradients on parts impinged upon. Further temperature differences between a center and edge of a first plate to be contacted by plasma ranges within hundreds of degrees Celsius. This gradient can generate significant thermal stress to cause failure of the plate. According to conventional processes, segmenting fluid distribution plates into concentrically nested structures has proven to be a relatively effective form of interrupting the gradients and therefore reduce the internal stresses, while maintaining process uniformity. This, however, increases the cost of parts significantly and may lead to particles due to sliding between the segmented plates. Further, with increasing power requirements there may be a necessity for further plate optimization for a best geometry configuration of nested plates.

Accordingly, there is a need in the art for an improved fluid distribution member and/or assembly that maintains plasma or gas uniformity and can withstand the various conditions utilized during high temperature plasma or gas processes (e.g., withstanding wide thermal gradients and related stresses, and/or are economically viable, and/or are compatible with a plurality of chemistries, and/or the like).

BRIEF SUMMARY

Illustrated and disclosed herein are fluid distribution member assemblies arranged to mitigate thermal stresses and reduce the possibility of catastrophic failure of said baffles.

According to an example embodiment of the present invention, a fluid distribution member assembly for use in a substrate processing system includes a fluid distribution member having a central portion and a perimeter portion. The fluid distribution member defines at least one slot formed therethrough and the at least one slot extends along a non-radial path configured to allow the central portion to expand and rotate with respect to the perimeter portion.

According to an additional example embodiment of the present invention, a substrate processing apparatus includes a process chamber in which a work-piece can be treated with plasma, hot gas, or hot liquid and at least one fluid distribution member disposed within the process chamber and configured to distribute the plasma, gas, or liquid to the work-piece. The at least one fluid distribution member comprises a central portion and a perimeter portion, the at least one fluid distribution member defines at least one slot formed there-through, and the at least one slot extends along a non-radial path configured to allow the central portion to expand and rotate with respect to the perimeter portion.

According to yet another example embodiment of the present invention, a method for plasma processing a substrate includes generating reduced ion density plasma in a plasma generator, directing the reduced ion density plasma through a fluid distribution member, and exposing a work-piece to the reduced ion density plasma. The fluid distribution member comprises a central portion and a perimeter portion, the fluid distribution member defines at least one slot formed there-through, and the at least one slot extends along a non-radial path configured to allow the central portion to expand and rotate with respect to the perimeter portion.

The above described and other features are exemplified by the following figures and detailed description.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted. Referring now to the figures, wherein like elements employ the same numbering.

DETAILED DESCRIPTION

Figure 1:
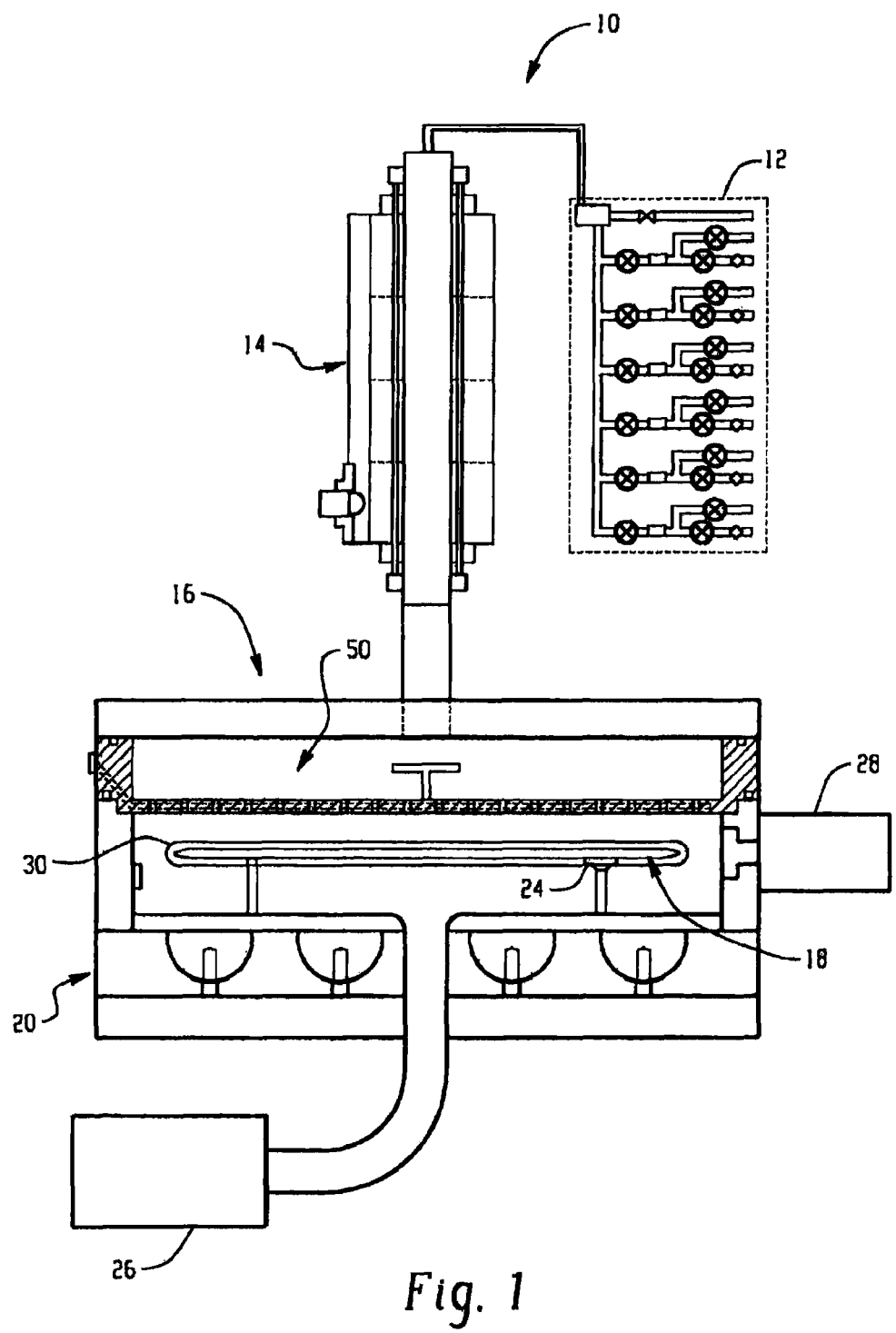
FIG. 1 is a sectional view of an exemplary plasma processing apparatus.

Example embodiments of the present invention are generally directed to a fluid distribution member and/or assemblies for use in plasma processing. A fluid distribution member assembly may generally include at least one fluid distribution member having one or more contiguous slots formed therethrough. At least one slot travels along a non-radial path that allows a central portion of the fluid distribution member to expand and rotate with respect/relative to a perimeter portion. For example, an appropriate shape/layout of the slot may be a substantially spiral or a spiral-like pattern of at least one slot. According to some example embodiments, a first end of the at least one slot begins within a zone located within ⅔ of the radius from the center of the fluid distribution member and extends outward in a non-radial or spiral direction that may be curved, curvilinear or linear, and has a total length of at least ⅓ of the fluid distribution member radius. This slot may be in the form of a spiral, a set of concentric polygons or any other suitable geometric shape wherein the slot or slots serve to allow nearly free or relatively free expansion of the material comprising the fluid distribution member. During operation, the gas or energetic components of the plasma flows through these slots. The presence of the slot or slots allows a central region of the fluid distribution member to almost freely expand as the member heats, causing a slight rotation of the central region with respect to the outer, cooler region of the fluid distribution member.

Functional purposes of these slots are two fold. From a process perspective the slots redistribute gas or fluid flow to achieve nearly optimum dry ash profile uniformity. From a parts structural integrity perspective the slots allow for quasi-unconstrained expansion so as to nearly minimize internal stresses within parts. Geometry of the structure defined by any two neighboring slots self-connected or not acts as a support of the material in the middle area of the fluid distribution member. Semi-tangential orientation of the supporting member(s) comprising this structure allows the material in the central region to expand and in essence allow for radial strain while relieving internal stresses via relative polar movement of the inner region.

It should be noted that while the term "spiral" could be interpreted as a very specific mathematical term described most easily using polar coordinates, wherein the radius is a continuous monotonic function of angle, or requiring a curve which emanates from a central point along a path having a dimension from the central point that that progressively increases, it will be understood that the term "spiral" as used herein is meant to be interpreted more generally as curved, linear, curvilinear or rectilinear pattern that winds around a point at an increasing or decreasing distance from the point. As such, the term "spiral" is meant to encompass any commonly found configuration ranging from a grooved-slot on a record to a rectangular spiral staircase, and any configuration similar to those depicted in the various embodiments disclosed herein.

Hereinafter, the present invention will be described more fully with reference to the accompanying drawings, in which example embodiments of the present invention are shown.

FIG. 1 illustrates an exemplary photoresist asher 10, generally comprising a gas box 12, a microwave plasma generator assembly 14, a process chamber 16 defining an interior cavity in which is processed a semiconductor substrate such as a wafer 18, and a radiant heater assembly 20 for heating the wafer 18 situated at the bottom of the process chamber. A temperature probe 24, such as a thermocouple, is often used to monitor the temperature of the wafer 18 during operation. A vacuum pump 26 is used to evacuate the process chamber 16 for processes requiring vacuum conditions.

An optional monochromator 28 is used to monitor the optical emission characteristics of gases within the chamber to aid in process endpoint determination. The wafer 18 is introduced into and removed from the process chamber 16 via an appropriate load lock mechanism (not shown) via entry/exit passageway 30. Alternately, the wafer 18 may be introduced directly into the process chamber 16 through the entry/exit passageway 30 if the tool is not equipped with a load lock. Although the present disclosure is shown and characterized as being implemented within a photoresist asher, it may also be used in other semiconductor manufacturing equipment, such as a plasma etcher or a plasma deposition system. For example, downstream axial flow plasma apparatuses particularly suitable for modification in the present disclosure are plasma ashers, such as for example, those microwave plasma ashers available under the trade name RadiantStrip320 and commercially available from Axcelis Technologies Corporation. Portions of the microwave plasma asher are described in U.S. Pat. Nos. 5,498,308 and 4,341,592, and PCT International Application No. WO/97/37055, herein incorporated by reference in their entireties. As will be discussed below, the disclosure is not intended to be limited to any particular plasma asher in this or in the following embodiments. For instance, the processing plasma can be formed using a parallel-plate, capacitively-coupled plasma source, an inductively coupled plasma source, and any combination thereof, with and without DC magnet systems. Alternately, the processing plasma can be formed using electron cyclotron resonance. In yet another embodiment, the processing plasma is formed from the launching of a Helicon wave. In yet another embodiment, the processing plasma is formed from a propagating surface wave. Additionally the disclosure encompasses any semiconductor process apparatus requiring a gas or plasma distribution where the elements of the gas or plasma distribution comprises a sufficient heat load on the glass, fused silica, ceramic and/or metal elements of the distribution system such that materials would suffer stress cracking or distortion.

Positioned within the plasma chamber 16 is a fluid distribution member or assembly, generally designated by reference numeral 50. Although shown as a single layered fluid distribution member assembly, it is contemplated that the fluid distribution member assembly may take the form of one or more fluid distribution members. Likewise, the single layered fluid distribution member assembly may further include an impingement disc thereon such as is generally disclosed in US Pat. Pub No. 2004/0238123, which is hereby incorporated herein by reference in its entirety. In any of the above described embodiments, the fluid distribution members and/or assemblies evenly distribute the reactive gas or plasma across the surface of the wafer 18 being processed. As will be discussed in greater detail herein, at least one of the fluid distribution members includes the spiral slot construction as discussed in greater detail below, which has been found to minimize heat stresses during operation.

Figure 2:
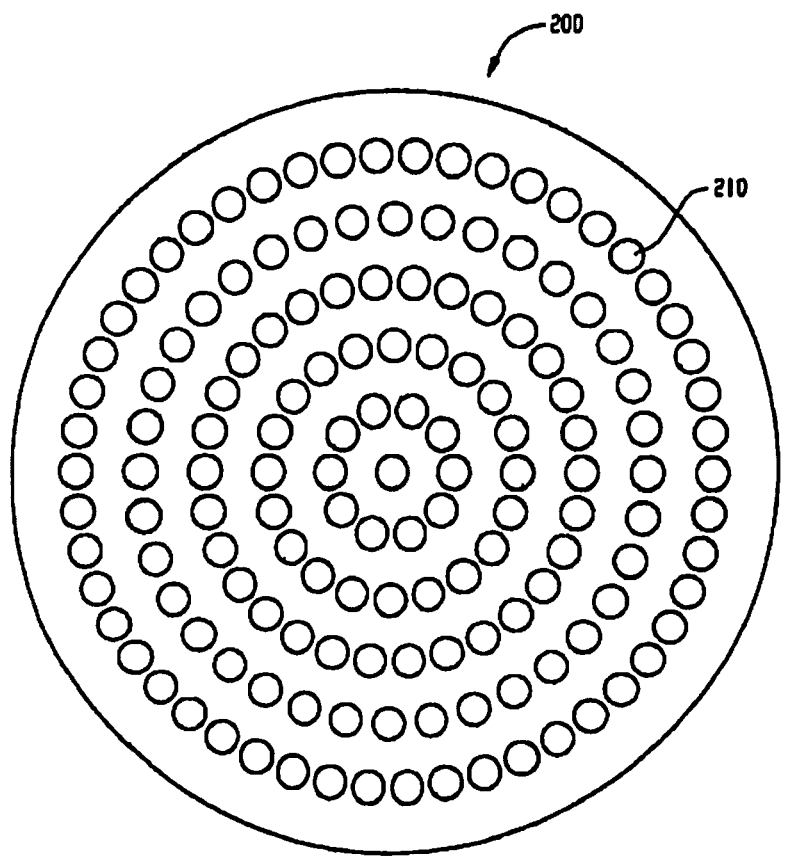
FIG. 2 is a view of a conventional fluid distribution member.

Turning to FIG. 2, a conventional, single-piece fluid distribution member assembly 200 is illustrated. The fluid distribution member assembly 200 generally includes an array of holes through which the gas or plasma flows. The hole pattern, hole size, and hole density is chosen to distribute the gas or plasma over the work surface.

Figure 3:
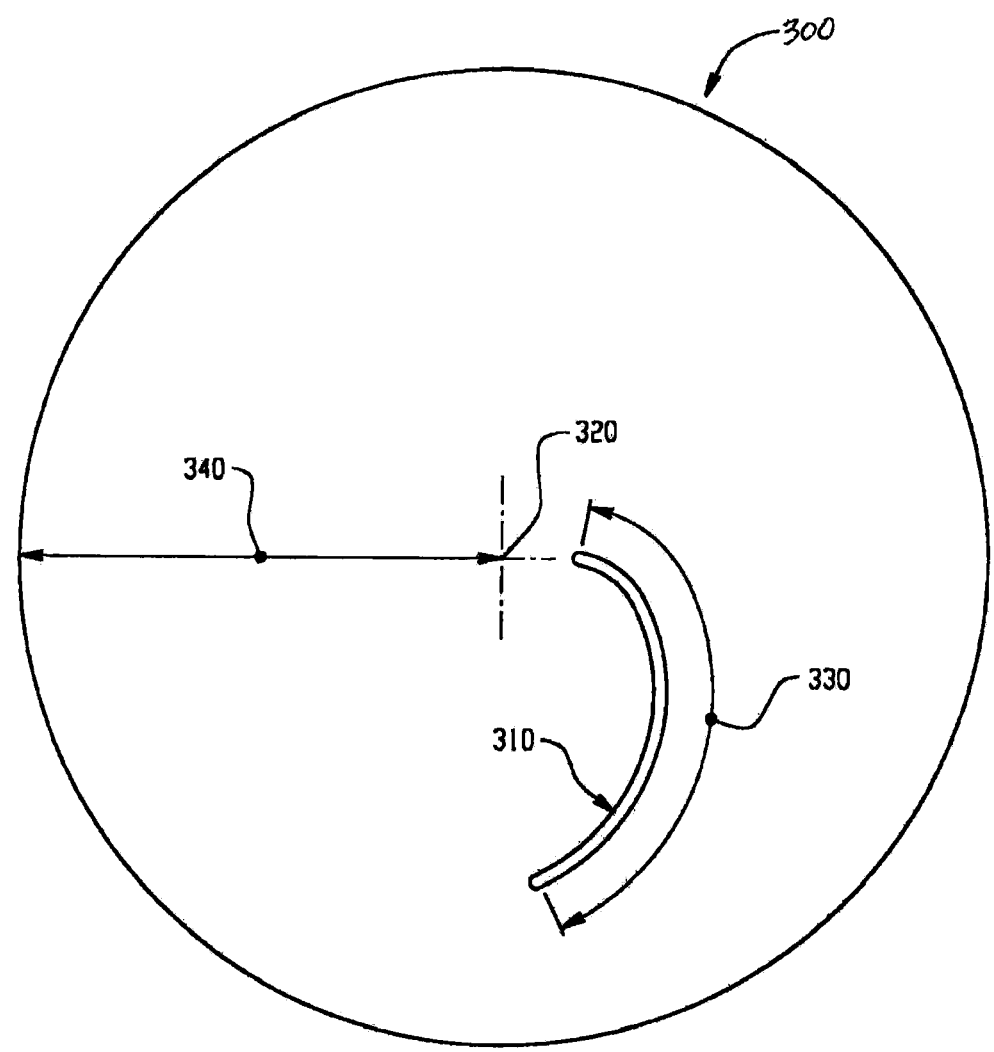
FIG. 3 depicts zones on an example fluid distribution member.

Turning to FIG. 3 a single piece fluid distribution member assembly 300 is illustrated. As shown, the fluid distribution member assembly 300 includes a slot 310 being cut/formed there-through, wherein the slot 310 begins at a region within ⅔ of the radius 340 as measured from the distribution member's center 320 and proceeds towards the outer edge. According to this example embodiment, the cut path length 330 is greater than or equal to ⅓ of the plate radius (340)

Figure 4:
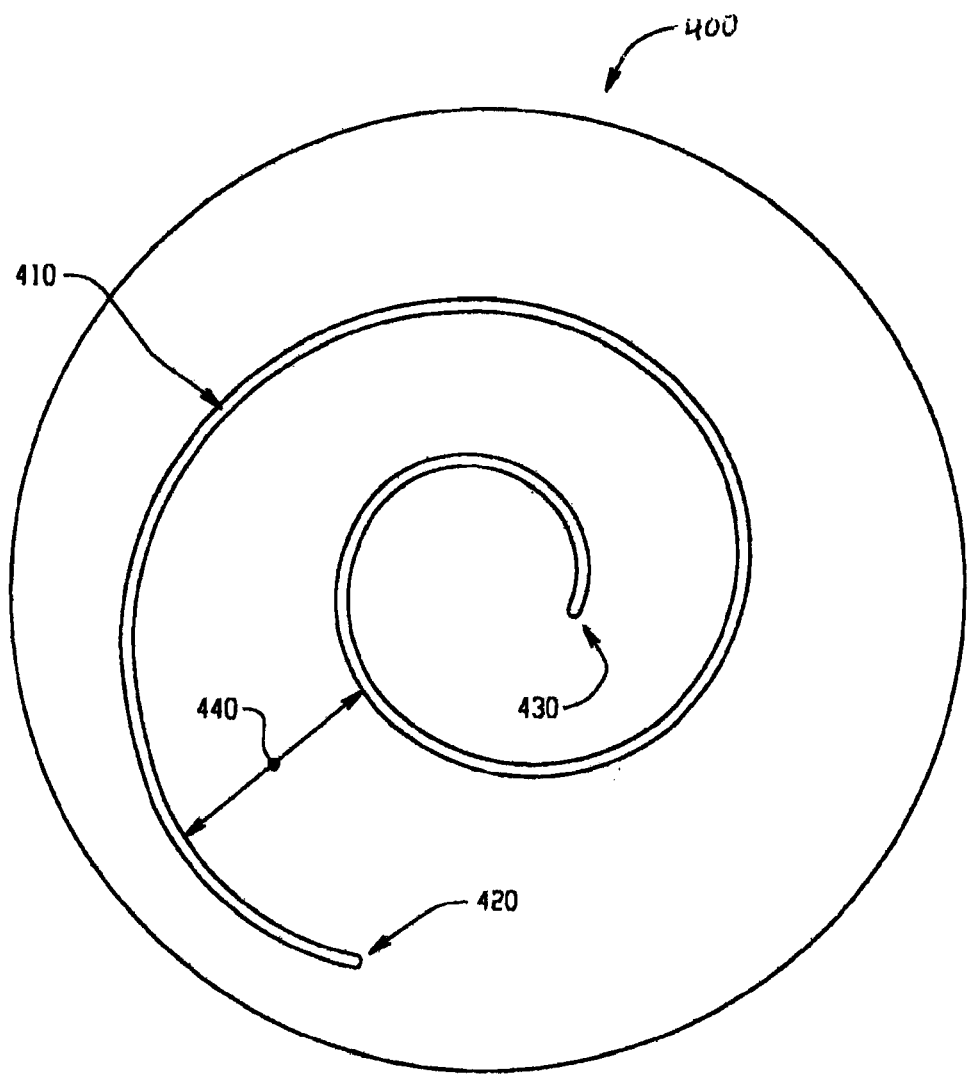
FIG. 4 depicts a fluid distribution member assembly in accordance with an embodiment.

Now tuning to FIG. 4, a single piece fluid distribution member assembly 400 is illustrated. As shown, the fluid distribution member assembly 400 includes a spiral slot 410 being cut/formed there-through. The slot 410 begins in a region that is within ⅔ of the fluid distribution member radius from the fluid distribution member center, and extends to a region further outward from the fluid distribution member center wherein the slot path length is greater than or equal to ⅓ of the fluid distribution member radius. The spiral slot 410 may be considered of either constant or varying width formed or cut through the fluid distribution member 400. As shown, the spiral slot 410 includes a first end 430 and a second end 420. The second end stops further outward from the distribution member center than the first end and the slot includes a total path length of greater than or equal to ⅓ of the distribution member radius. The width of the slot 410 may be varied from the first end 430 to the second end 420 as necessary to control the gas or plasma flow as needed to obtain a relatively uniform flow over a work piece located downstream of the fluid distribution member 400.

As noted, the spiral slot 410 incorporates a pitch 440. This pitch may be constant from the first end 430 to the second end 420 of the spiral slot 410 as particularly illustrated, or may vary according to any desired implementation. As additionally noted, the spiral slot 410 extends from the center of the fluid distribution member assembly outward as measured from the radius of the spiral slot 410. However, the same may be described as progressing inward as well.

Figure 5:
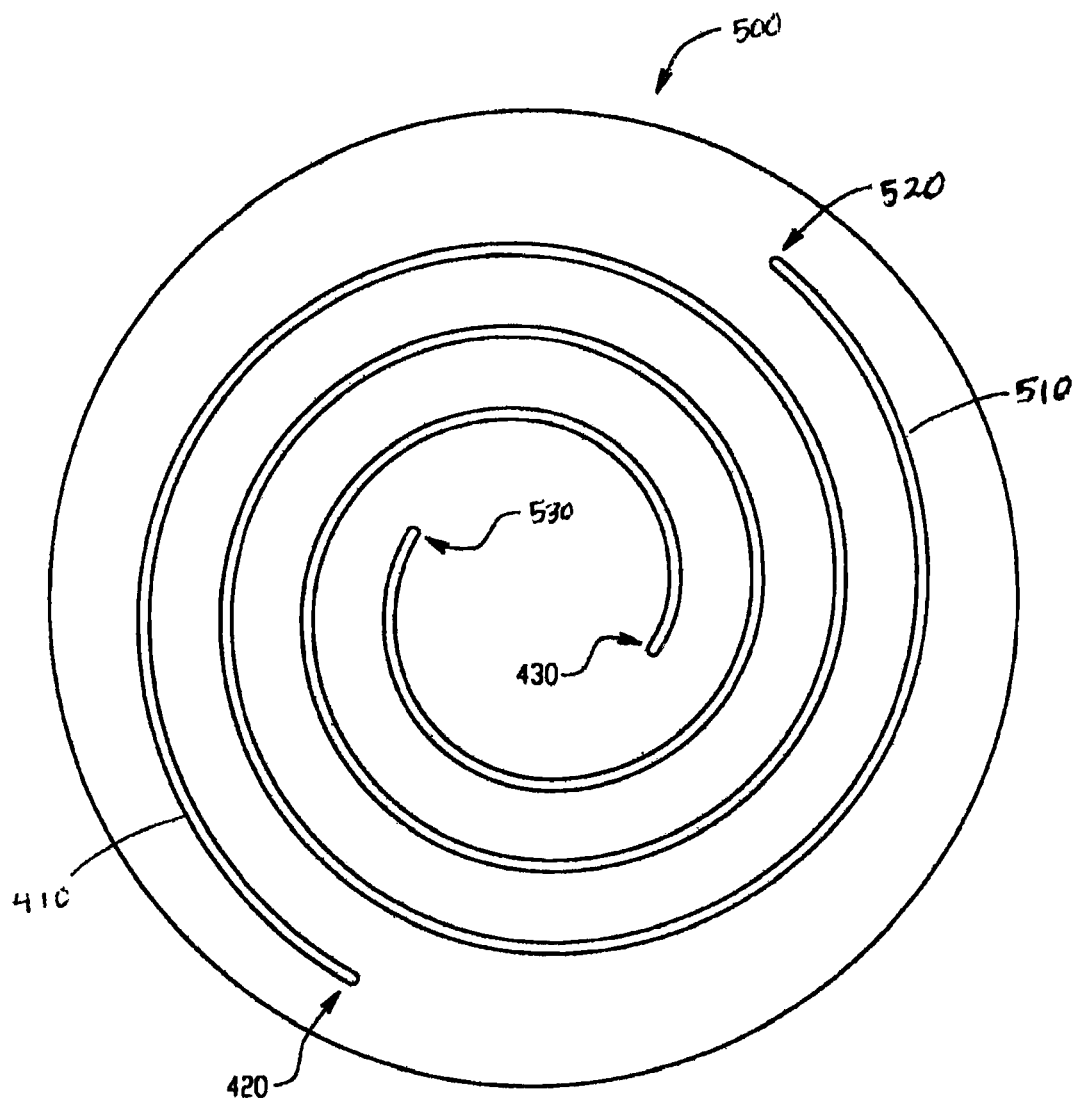
FIG. 5 depicts a fluid distribution member assembly in accordance with an embodiment.

Although illustrated and described above in terms of a single spiral slot, it should be understood that one or more slots may be formed through a fluid distribution member assembly according to any desired implementation. For example, turning now to FIG. 5, a fluid distribution member assembly 500 including two spiral slots 410 and 510, having beginnings 430 and 530 and endings 420 and 520. As illustrated, the path length of at least one of the spirals is greater than or equal to ⅓ of the radius of the fluid distribution member 500.

Figure 6:
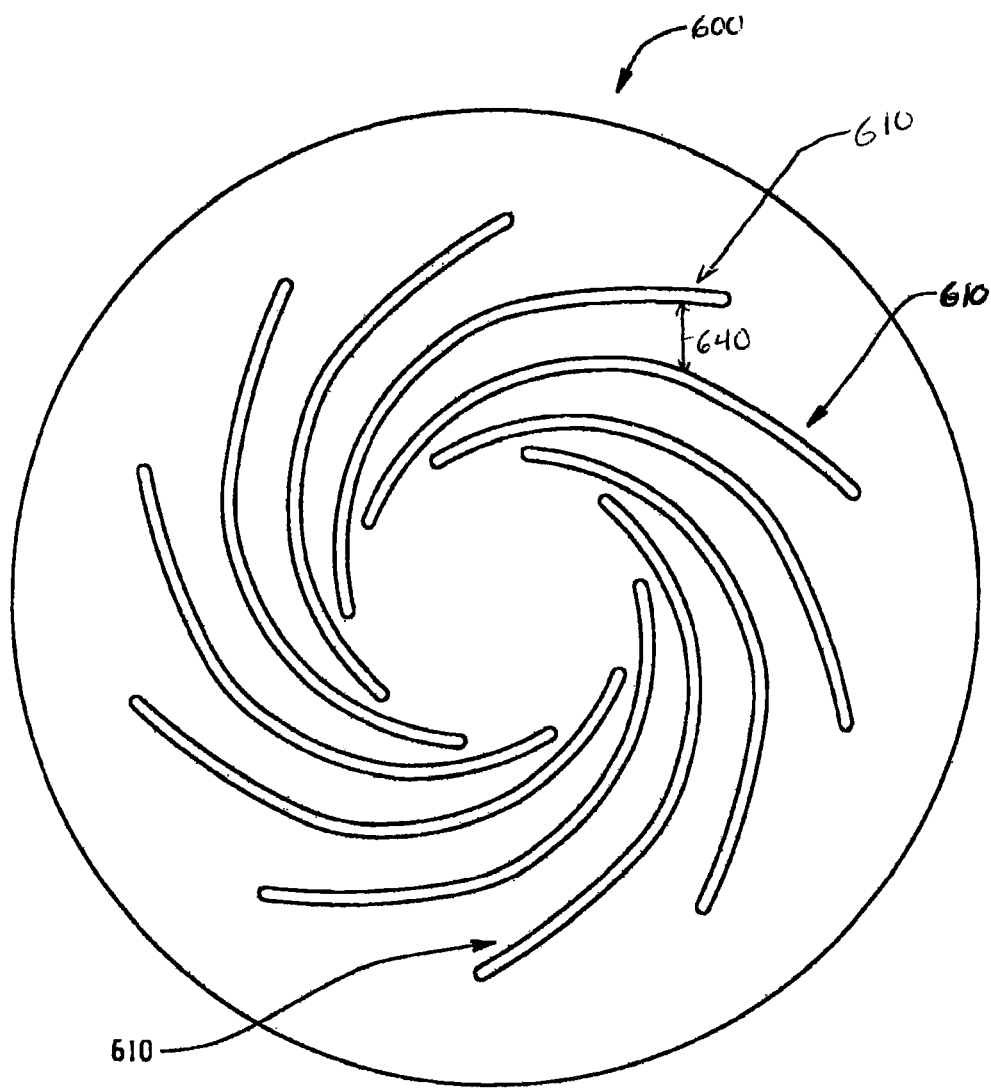
FIG. 6 depicts a fluid distribution member assembly in accordance with an embodiment.

Turning now to FIG. 6, a fluid distribution member assembly 600 including a plurality of slots 610 is illustrated. As shown, the plurality of slots 610 are cut or formed into the fluid distribution member 600, wherein at least one of the slots begins within ⅔ of the radius of the fluid distribution member from the center and extends a total path length of greater than or equal to ⅓ of the fluid distribution member radius.

As shown, the slots 610 travel along non-radial paths that allow the central portion of the distribution member 600 to expand and rotate with respect to the perimeter portion. Further, as portions 640 between the slots 610 expand (e.g., "legs"), the portions 640 push tangentially on the center portion causing it to rotate. In this manner, thermal and mechanical stress is relaxed.

Figure 7:
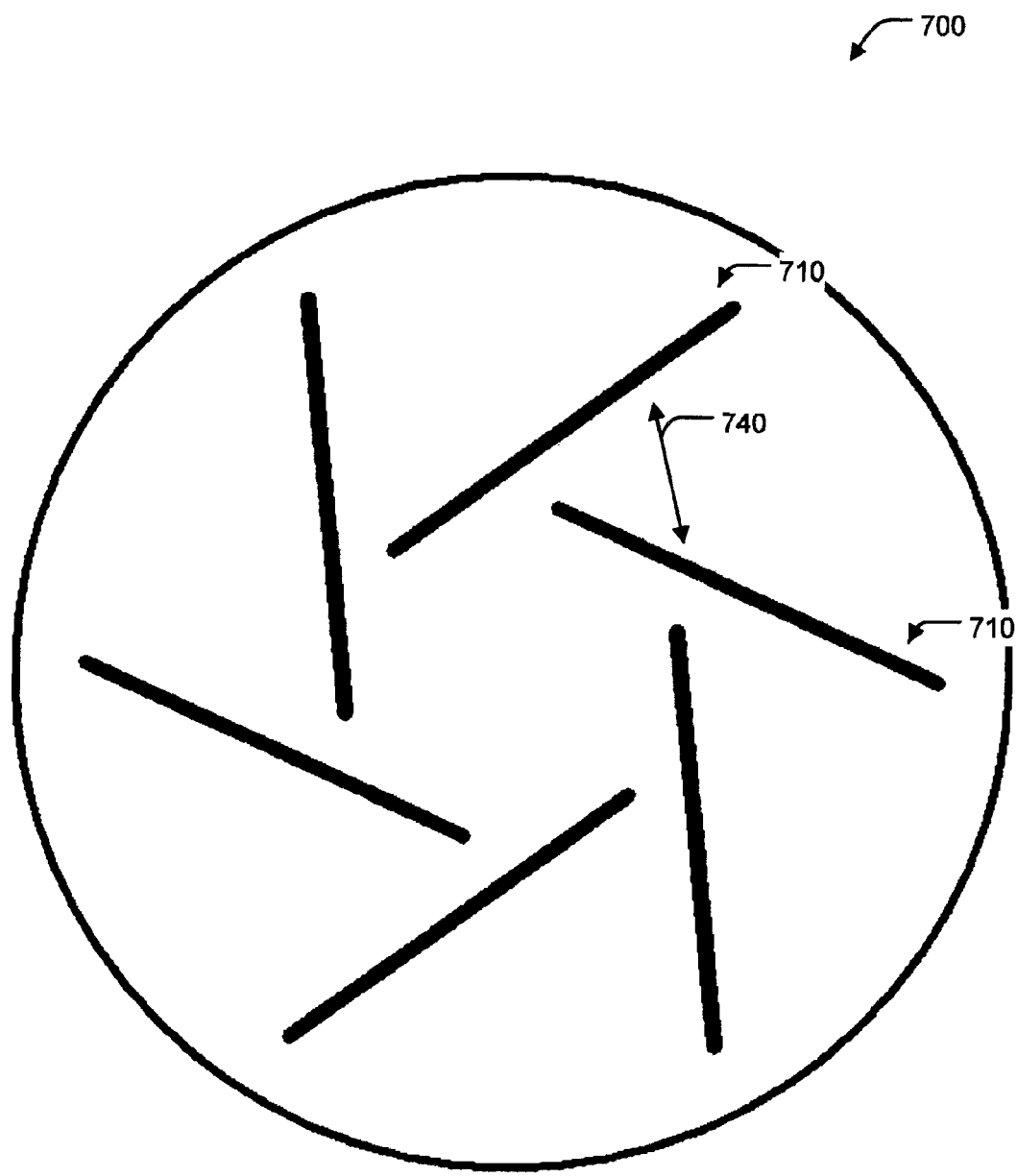
FIG. 7 depicts a fluid distribution member assembly in accordance with an embodiment.

It should be noted that although the slots 610 are illustrated as curved, the slots 610 may also be linear, extending generally from the center portion of the distribution member 600 non-radially, thereby being disposed to cause the mechanical rotation described above. For example, FIG. 7 depicts a fluid distribution member assembly with linear slots extending non-radially from a center portion of a fluid distribution member assembly. In contrast, conventional radially extending slots or grooves (as disclosed, for example, in U.S. Pat. No. 6,444,040), when exposed to heat, would push radially on the center portion of the distribution member causing compression. Likewise, the center portion would expand outwardly causing additional stress.

Turning now to FIG. 7, a fluid distribution member assembly 700 including a plurality of slots 710 is illustrated. As shown, the plurality of slots 710 are cut or formed into the fluid distribution member 700, wherein at least one of the slots begins within ⅔ of the radius of the fluid distribution member from the center and extends a total path length of greater than or equal to ⅓ of the fluid distribution member radius.

As shown, the slots 710 travel along non-radial paths that allow the central portion of the distribution member 700 to expand and rotate with respect to the perimeter portion. Further, as portions 740 between the slots 710 expand (e.g., "legs"), the portions 740 push tangentially on the center portion causing it to rotate. In this manner, thermal and mechanical stress is relaxed.

Thus, as described above, example embodiments of the present invention include fluid distribution member assemblies comprising one or more slots or slots formed therethrough. These slots may be circular or spiral-like in shape and orientation, extending non-radially from a center portion of the fluid distribution member. However, as noted above and according to additional example embodiments, the one or more slots may be segmented or formed of differing segments as shown in FIGS. 8-9.

Figure 8:
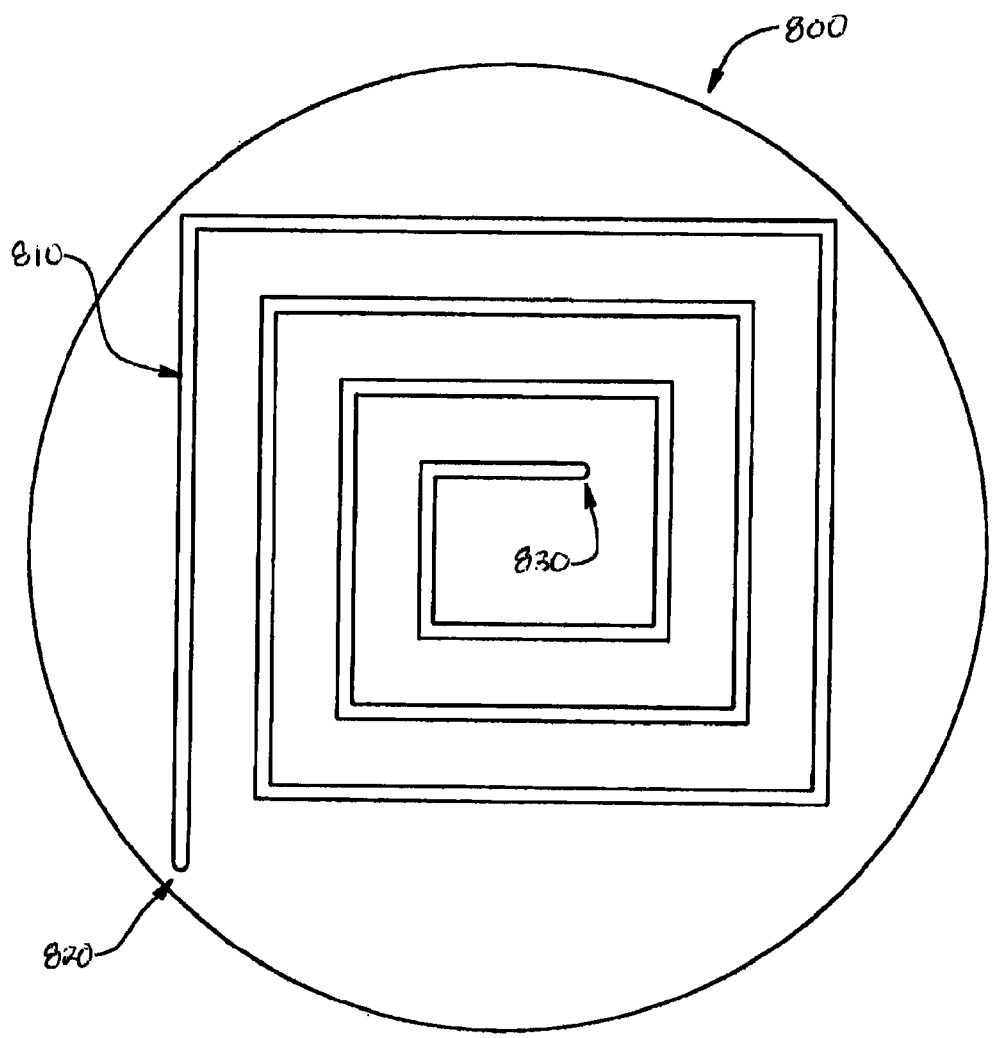
FIG. 8 depicts a fluid distribution member assembly in accordance with an embodiment.
Figure 9:
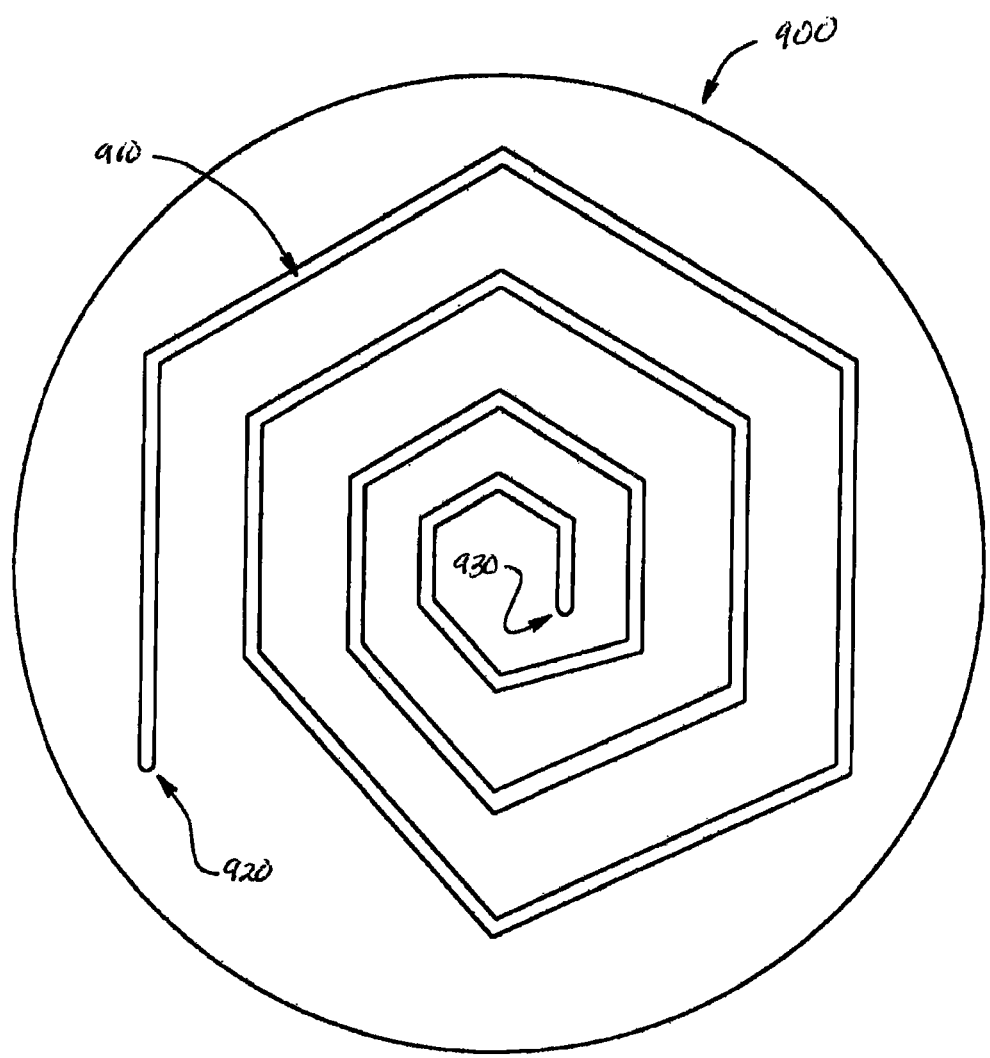
FIG. 9 depicts a fluid distribution member assembly in accordance with an embodiment.

Turning to FIG. 8, the slot 810, having a beginning 830 located within ⅔ of the fluid distribution member 800 radius as measured from the center, and proceeds outward towards an end 820 through a series of connected straight-line segments, wherein the total path-length of the series of straight lines is greater than or equal to ⅓ of the distribution member radius. These straight-lines may be orthogonal as shown in FIG. 8, or may be a connected series of non-orthogonal line segments 910 as shown in FIG. 9. The segments 910 of fluid distribution member 900 begin at point 930 and extend outward to an endpoint 920, wherein the total path length is greater than or equal to ⅓ of the fluid distribution member radius.

Figure 10:
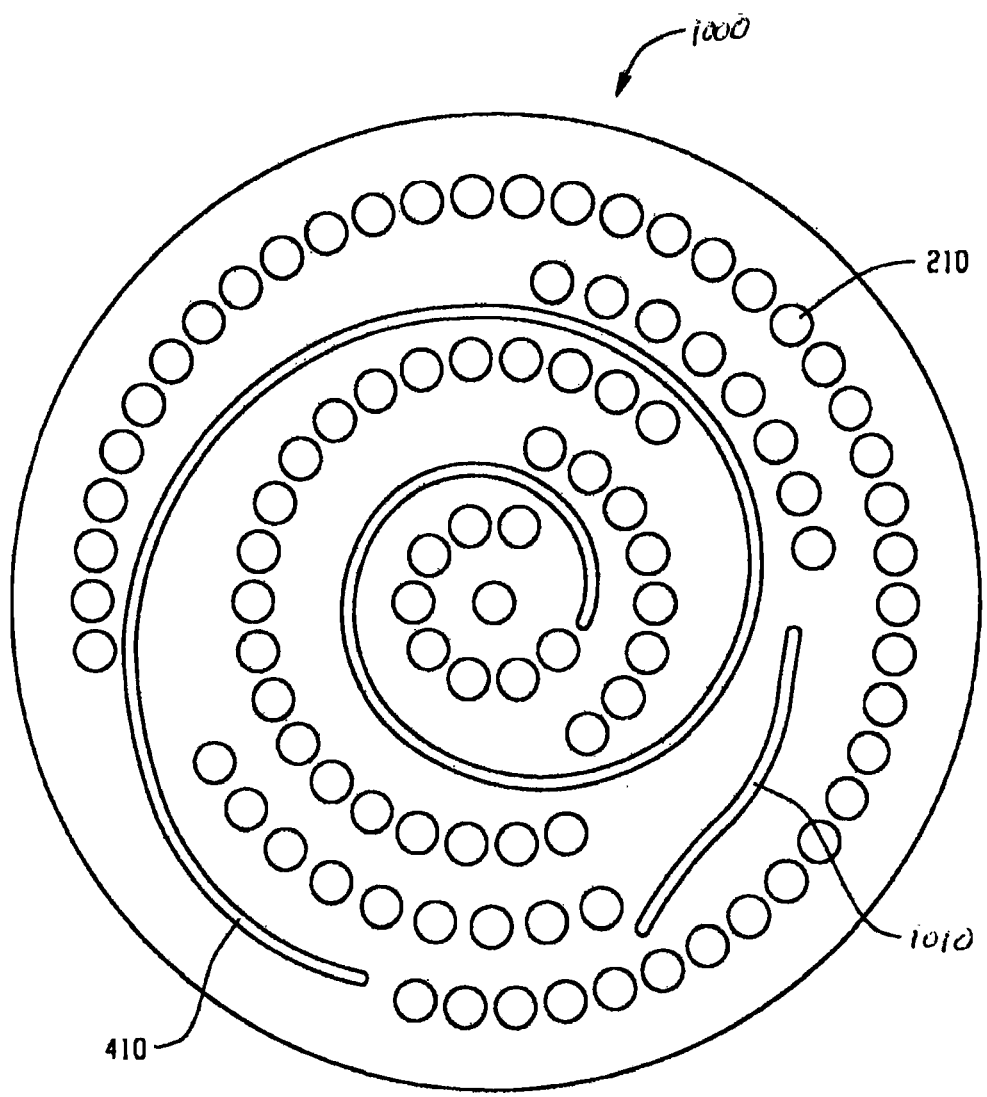
FIG. 10 depicts a fluid distribution member assembly in accordance with an embodiment.

Additionally, example embodiments may include any combination of the slotted and/or through-hole features described above. For example, as shown in FIG. 10, a fluid distribution member assembly 1000 may include at least one slot 410 formed there-through beginning within ⅔ of the plate radius from the plate center and extending outward, having a total path length of greater than or equal to ⅓ of the fluid distribution member radius, combined with one or more holes 210 and slots 1010.

It should be understood that although described and illustrated as general fluid distribution member assemblies which may be considered substantially planar, the same may be varied according to any desired implementation. For example, FIGS. 11A-11E depict elevation and cross-sectional views of fluid distribution members in accordance with example embodiments.

Figure 11A:
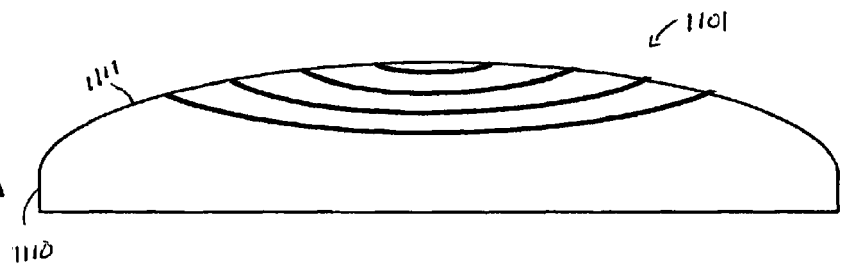
FIG. 11A depicts an elevation view of a fluid distribution member in accordance with an example embodiment.

As illustrated in FIG. 11A, a fluid distribution member may include a compound first surface 1111 arranged in a generally convex or concave manner and proximate side walls 1110. It should be appreciated that any of the spiral arrangements noted above may be formed on the first surface 1101. The side walls 1110 may be generally flat and may surround the entire fluid distribution member 1101. Alternatively, the side walls 1110 may be compound and may include locking means or protrusions to facilitate arrangement of the fluid distribution member in a processing apparatus, for example, as illustrated in FIG. 1.

Figure 11B:
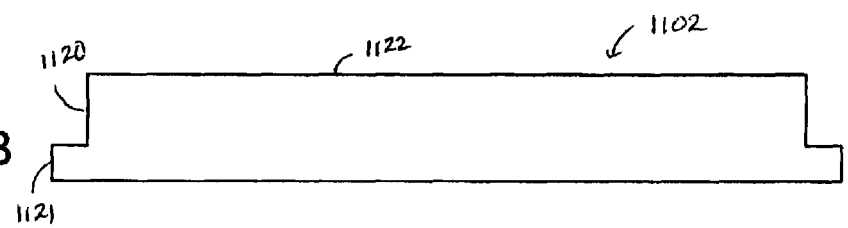
FIG. 11B depicts a cross-sectional view of a fluid distribution member in accordance with an example embodiment.

As illustrated in FIG. 11B, a fluid distribution member 1102 may include a substantially planar first surface 1122 proximate side walls 1120. The side walls 1120 may be generally flat and may surround the entire fluid distribution member 1101. The fluid distribution member 1102 may further include protrusions 1121 proximate the side walls 1120, configured to facilitate arrangement of the fluid distribution member in a processing apparatus, for example, as illustrated in FIG. 1.

Figure 11C:
FIG. 11C depicts a cross-sectional view of a fluid distribution member in accordance with an example embodiment.

As illustrated in FIG. 11C, a fluid distribution member 1103 may be substantially planar.

Figure 11D:
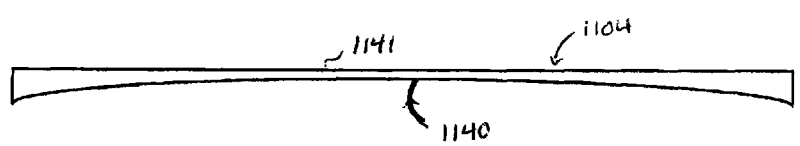
FIG. 11D depicts a cross-sectional view of a fluid distribution member in accordance with an example embodiment.

As illustrated in FIG. 11D, a fluid distribution member 1104 may be substantially planar and of varying thickness. The fluid distribution member 1104 may include a substantially planar first surface 1141 and an opposing, substantially concave second surface 1140.

Figure 11E:
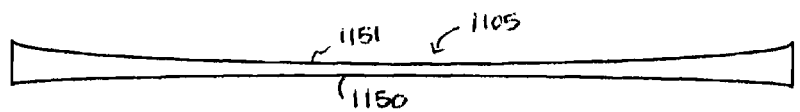
FIG. 11E depicts a cross-sectional view of a fluid distribution member in accordance with an example embodiment.

As illustrated in FIG. 11E, a fluid distribution member 1105 may include two, opposing and substantially concave surfaces 1150 and 1151.

Figure 12:
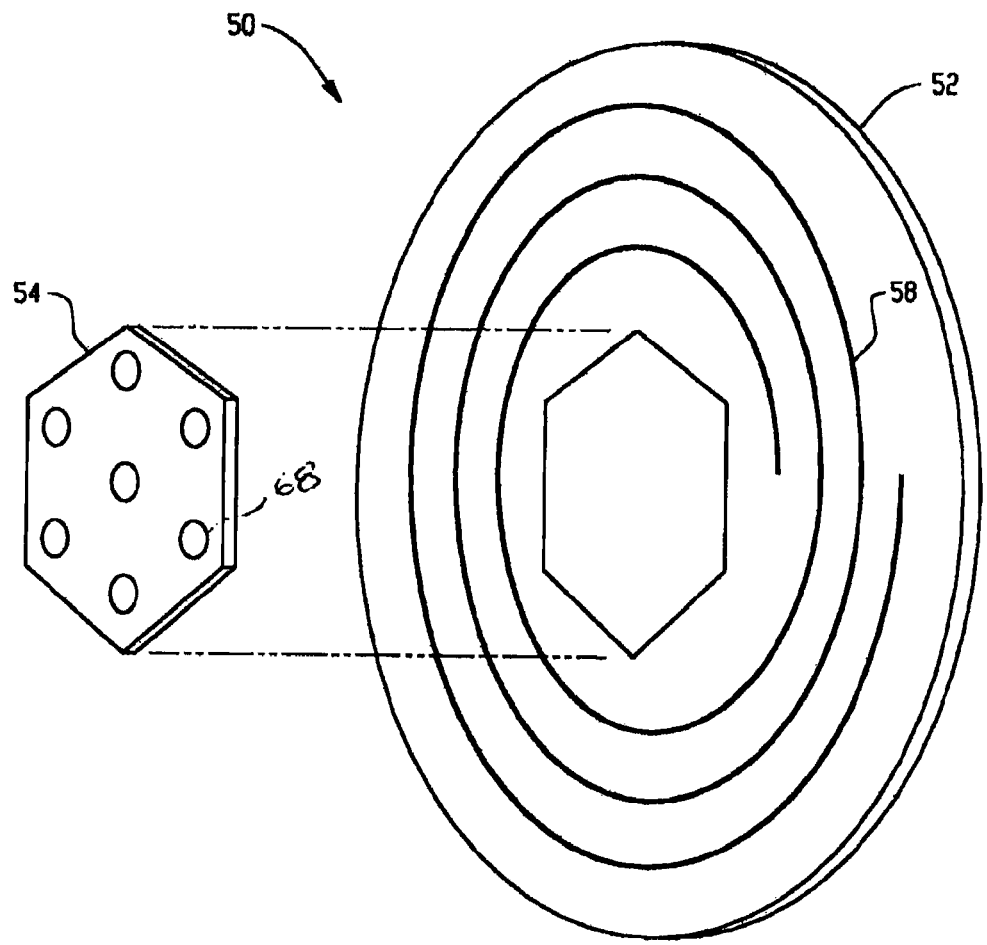
FIG. 12 depicts a fluid distribution member assembly in accordance with an embodiment.
Figure 16:
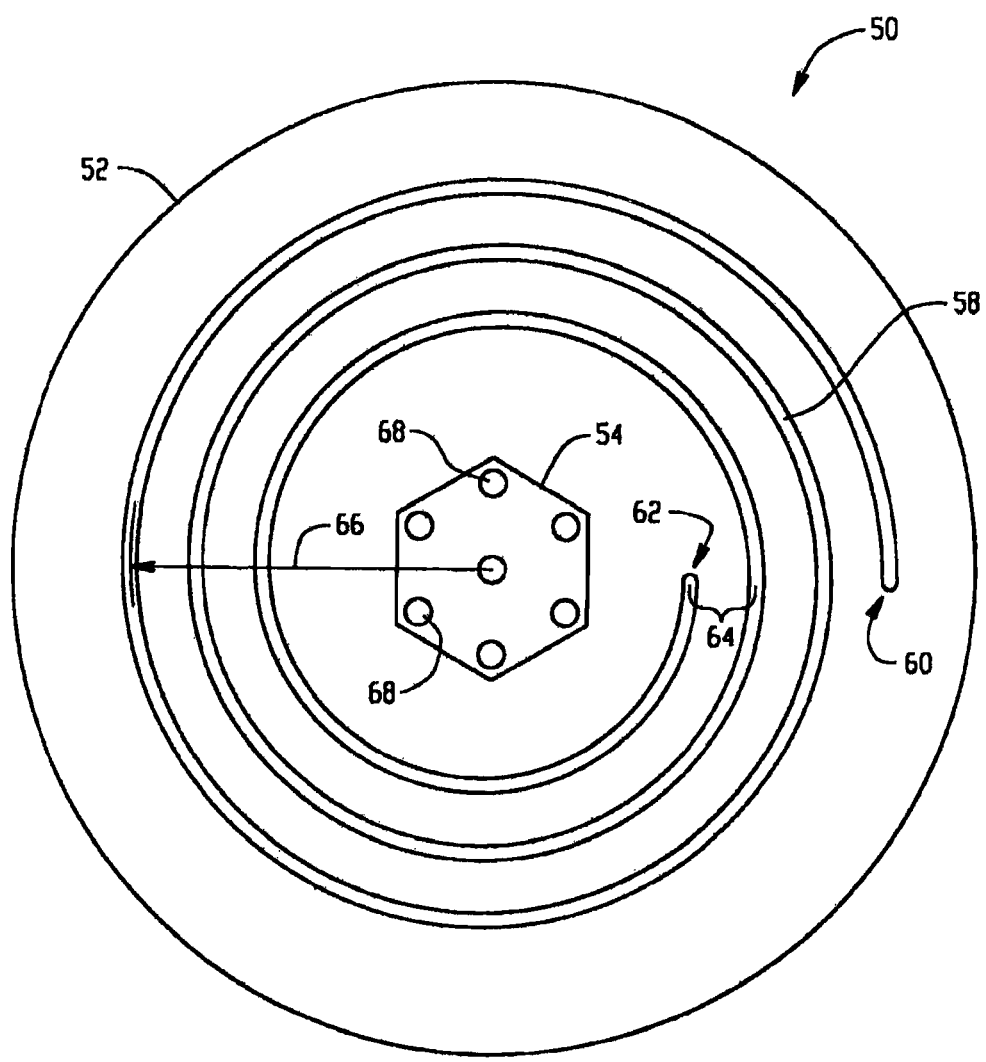
FIG. 16 depicts a fluid distribution member assembly in accordance with an embodiment.

As illustrated in FIGS. 12 and 16, the exemplary multi-piece fluid distribution member assembly 50 may optionally include a hexagonally shaped opening 56 formed on a fluid distribution member 52 and a hexagonally shaped insert portion 54 configured to fit within the opening 56. It should be apparent that the shapes of the opening 56 and the insert portion 54 may be of any desired or appropriate shape. Moreover, the fluid distribution member 52 may include more than one insert portions. In the example embodiment shown, the hexagonal shape is configured to accommodate some or all of the thermal stresses associated with a downstream plasma asher, wherein the plasma initially impinges to a large extent a central region of the fluid distribution member. However, such an arrangement can be equally applicable to any other plasma process. As previously described, an annular ring as well as the number of pieces forming the fluid distribution member assembly 50 can define any opening shape. Again, although applicant refers to an annular ring, it is contemplated that the various pieces do not include an annular ring. Rather, the multiple pieces are configured and constructed so as to form a single layer of the fluid distribution member 52. Furthermore, a locking means may be included to maintain the fluid distribution member 52 in a generally planar configuration and is well within the skill of those in the art.

The impingement disk/insert portion 54 may be may be formed of a similar or dissimilar material comprising the annular ring/fluid distribution member 52. The impingement disk 54 may include apertures 68 generally arranged there-through, or slots cut there-through, or any combination of apertures or slots cut there-through, or may be apertureless or may include a central apertureless region with circumscribing apertures or slots arranged thereabout.

Although described and illustrated as apertures, it should be understood that limiting these apertures to a constant diameter, geometry, diminishing interior diameter, or the particular arrangement illustrated is inappropriate. For example, through manipulation of the arrangement, geometry, size, and other characteristics of the apertures 68, the ashing rate and uniformity provided by at the fluid distribution member assembly may be adjusted to a variety of scenarios. Alternately, the impingement disc may also include a spiral slot (not shown) such as is generally defined for the annular ring 52.

Figure 13:
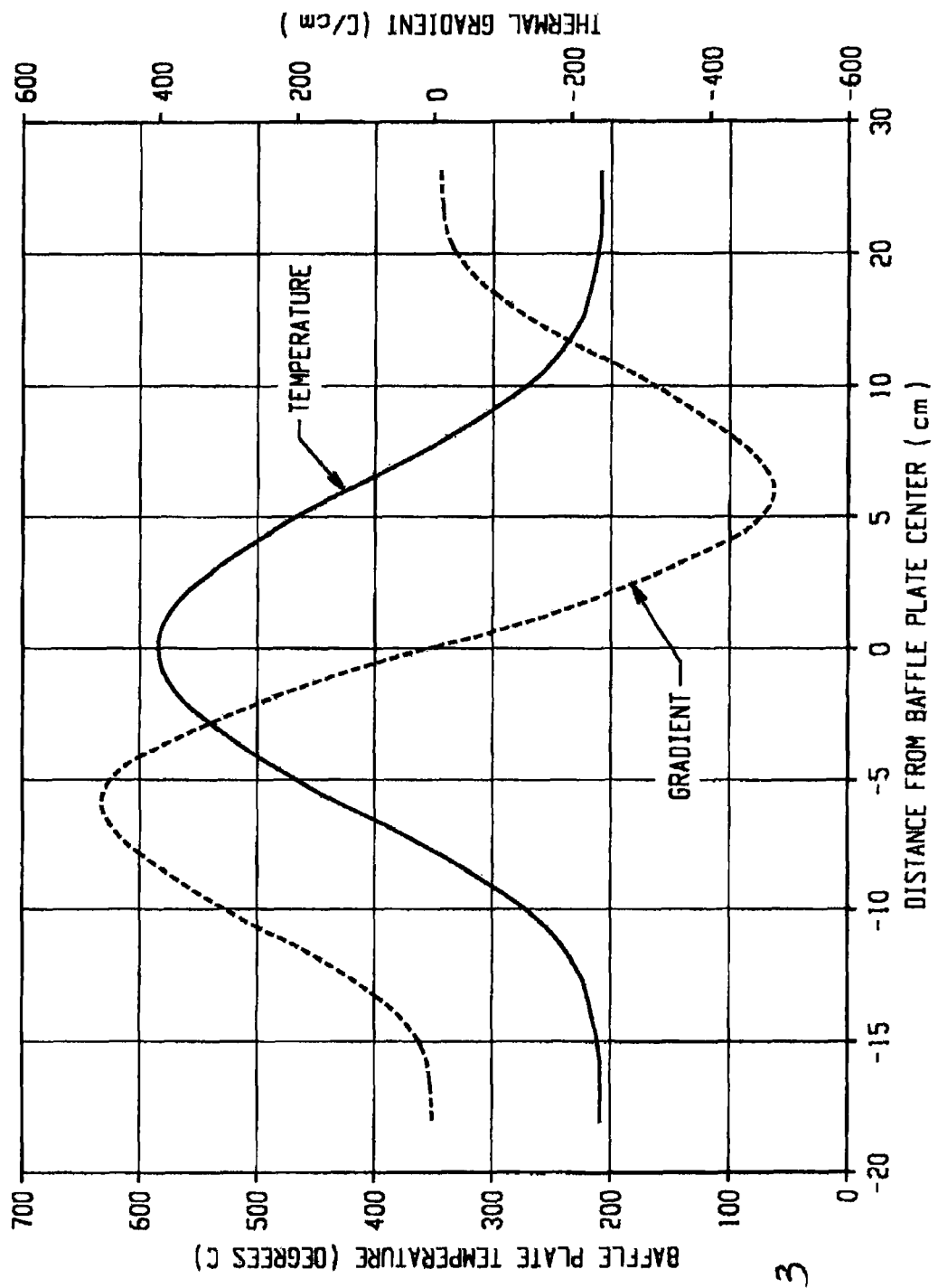
FIG. 13 depicts a temperature profile of the fluid distribution member assembly of FIG. 2.

FIG. 13 depicts an exemplary temperature profile of a fluid distribution member in operation in a microwave downstream asher. The magnitude of the thermal gradient exceeds 400° C./cm. With the inclusion of the baffle-plate holes, which concentrate the thermal stress, such a temperature profile can cause thermal stresses well in excess of 300 MPa in an exemplary fluid distribution member shown in FIG. 2.

Figure 14:
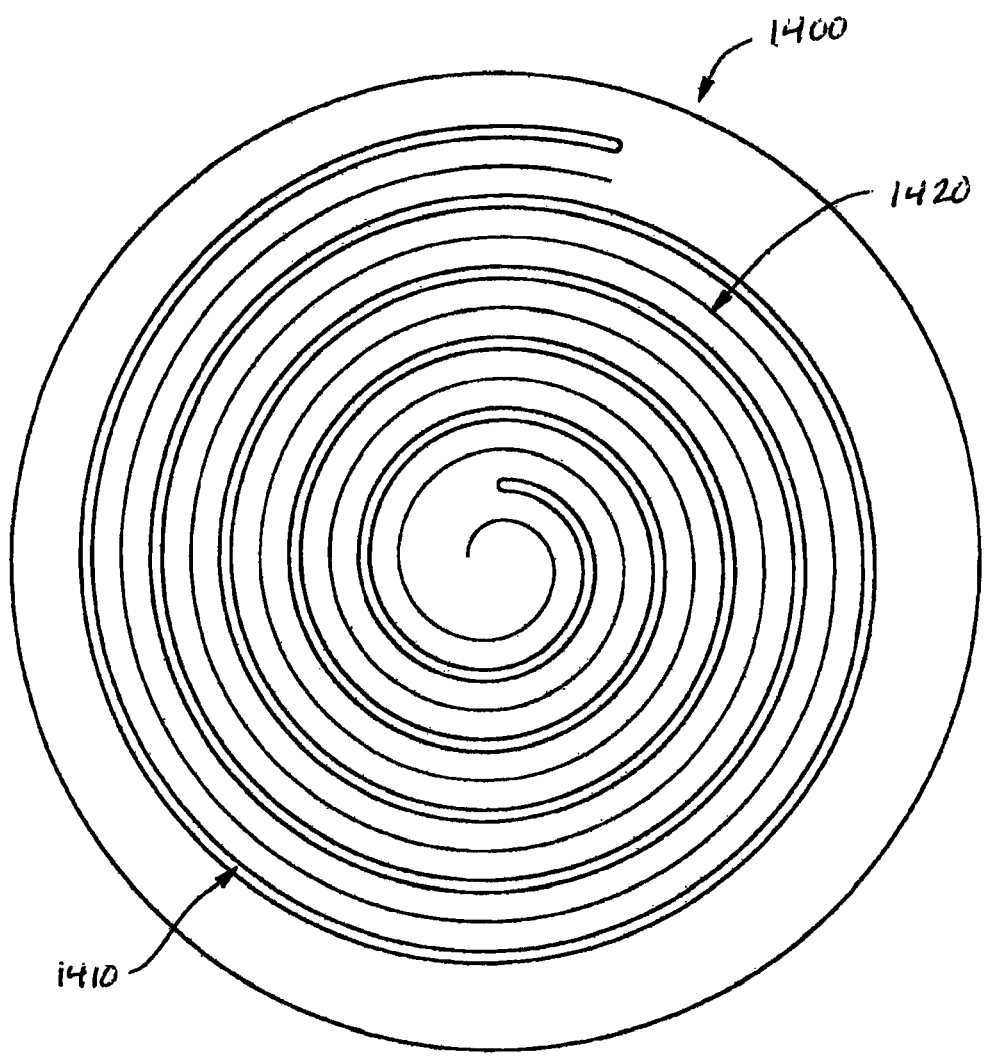
FIG. 14 depicts a fluid distribution member assembly in accordance with an embodiment.
Figure 15:
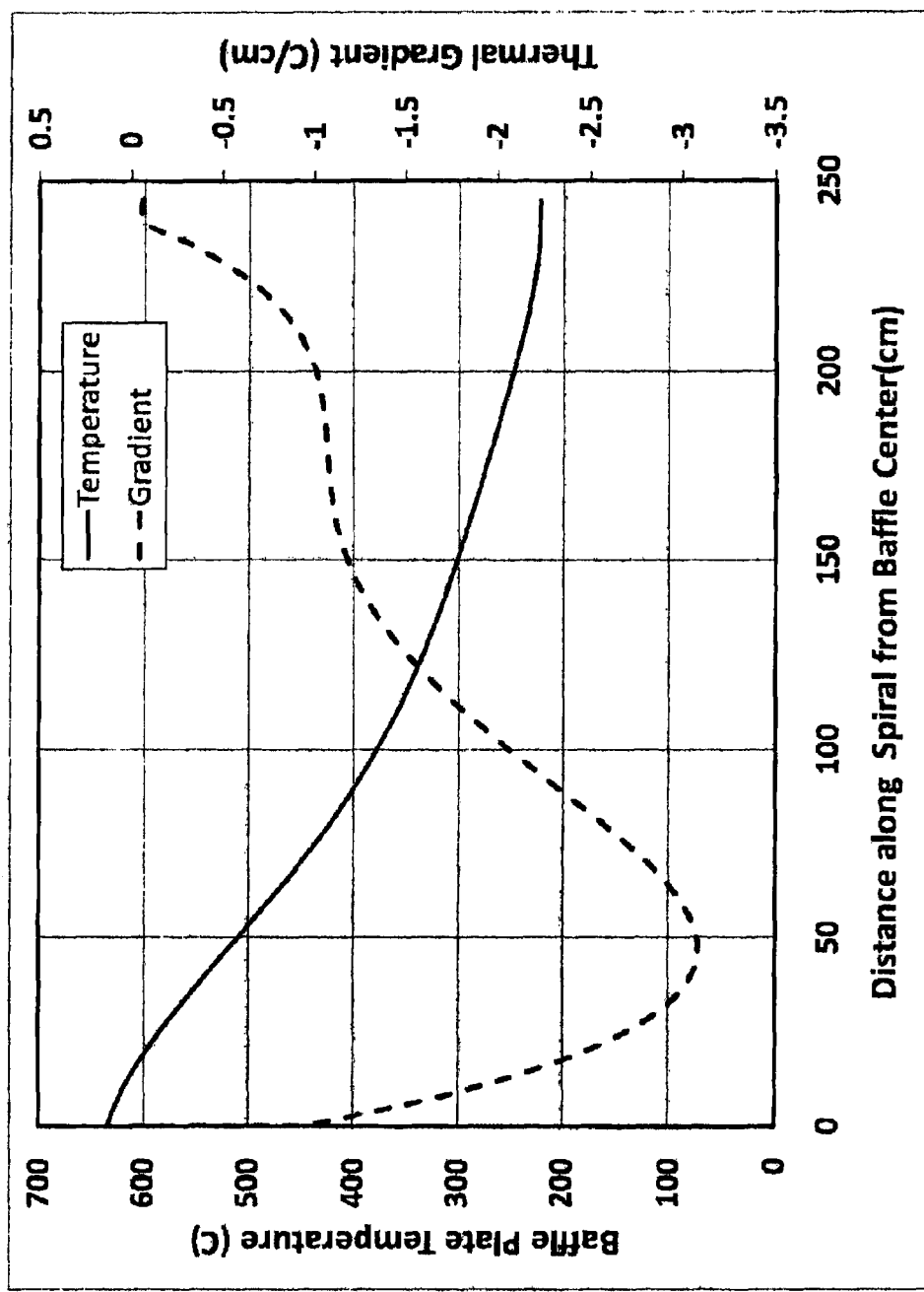
FIG. 15 depicts a temperature profile of the fluid distribution member assembly of FIG. 14.

FIG. 14 and FIG. 15 depict the temperature profile along path 1420 for a single spiral slot 1410 for a fluid distribution member 1400 used in a microwave downstream plasma asher. As can be seen in FIG. 15, the temperature is nearly linear in pathway length, and the magnitude of the thermal gradient is several orders of magnitude lower than in the exemplary fluid distribution member shown in FIG. 2. The calculated maximum stress due to thermal expansion is reduced to less than about 3 MPa. As illustrated, the fluid distribution member temperature profile has been modeled based on a spiral cut fluid distribution member with a constant pitch.

The fluid distribution member in accordance with any of the embodiments disclosed herein is preferably formed from a ceramic material, Fused Silica, metal or Glass. Suitable ceramic materials include, but are not intended to be limited to, alumina (various aluminum oxides), zirconium dioxides, various carbides such as silicon carbide, boron carbide, various nitrides such as silicon nitride, aluminum nitride, boron nitride, quartz, silicon dioxides, various oxynitrides such as silicon oxynitride, and the like as well as stabilized ceramics with elements such as magnesium, yttrium, praseodymia, haffiium, and the like. Suitable metals include, but are not intended to be limited to, aluminum, aluminum alloys, stainless steel, titanium, titanium alloys, silicon, and the like. Optionally, the lower single piece fluid distribution member can be the same or of a different material, typically fused silica or anodized aluminum. Furthermore, the fluid distribution member and/or impingement disc may be coated with a second material, for example, $Al_2O_3$, CeO, $SiO_2$, $TiO_2$, Si, and/or $Ta_3O_4$.

The fluid distribution member may additionally not be planar, but may be curved or thinned, for example, thinned in the center to enhance mechanical stability. Furthermore, it should be understood that multiple fluid distribution members may be used in a single plasma processing chamber, for example, arranged as a stack of one or more spiraled fluid distribution members, wherein the spirals are on different positions to reduce line-of-sight. Additionally the slots may be cut at an angle, for example at 45 degrees from the surface normal.

As disclosed and described in detail above, example embodiments of the present invention may include advantages such as even cooling across ceramic baffles and/or fluid distribution member assemblies which reduces the risk of fracture, and simplified construction of fluid distribution member assemblies for plasma processing systems. These fluid distribution member assemblies may be used in any applicable method for plasma processing of a substrate.

Figure 17:
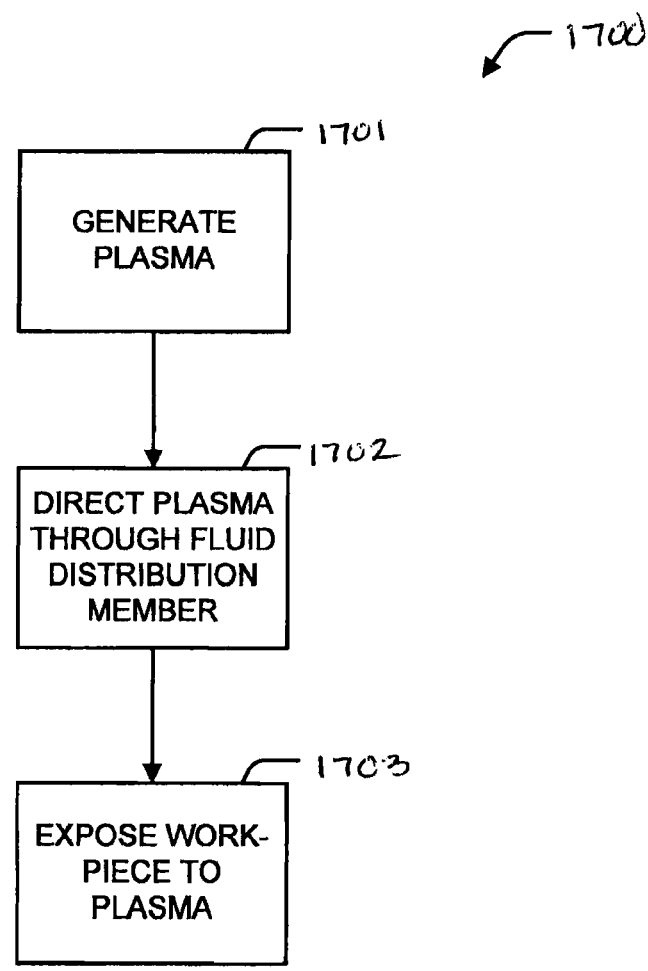
FIG. 17 depicts a method for plasma-processing of a workpiece.

For example, FIG. 17 depicts a method for plasma-processing of a work-piece, according to an example embodiment. The method 1700 may include generating reduced ion density plasma in a plasma generator at block 1701.

The method 1700 may further include directing the reduced ion density plasma through a fluid distribution member at block 1702. As described above, the fluid distribution member may include a central portion and a perimeter portion with at least one slot formed there-through. The at least one slot may extend along a non-radial path configured to allow the central portion to expand and rotate with respect to the perimeter portion during the method 1700.

The method 1700 further includes exposing the work-piece to the reduced ion density plasma.

It should be understood that although example embodiments are described in terms of downstream plasma processing devices and methods for reduced ion density exposure, example embodiments are not so limited. Example embodiments of fluid distribution member assemblies are applicable in any suitable plasma processing system, whether high-frequency electro-magnetic plasma processing or any other suitable system where use of a fluid distribution member is desirable.

Additionally, it should be understood that any of the above terms and any new terms used below should be construed as representing the most logically understood definition of said terms as would be understood by one of ordinary skill in the art of designing, testing, forming, manufacturing, or employing the example embodiments described herein.

The terminology as used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, pitch factors, etchings, coatings, additional slot configurations, or any other suitable or desired features.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A fluid distribution member assembly for use in a substrate processing system, comprising:
a fluid distribution member having a central portion and a perimeter portion, wherein the fluid distribution member is configured to (i) be arranged between a plasma generator assembly and a process chamber, separate from the plasma generator assembly, and (ii) receive plasma from the plasma generator assembly for distribution through the fluid distribution member into the process chamber, wherein the fluid distribution member includes a first slot formed there-through between the central portion and the perimeter portion, and wherein the first slot extends along a curved path,
wherein the curved path spirals relative to a fixed point on the fluid distribution member at a continuously increasing or continuously decreasing distance from the fixed point,
wherein the first slot comprises i) a beginning point within ⅔ of a radius of the fluid distribution member, the radius corresponding to a measurement from a fixed center point of the fluid distribution member to an outer perimeter of the fluid distribution member, and ii) an end point, wherein the beginning point and the end point define the curved path, and wherein a length of the first slot from the beginning point to the end point is such that
the first slot completely circumscribes the fixed point at least one time, and
wherein the curved path of the first slot allows for thermal expansion of the fluid distribution member such that the central portion of the fluid distribution member is configured to expand and rotate with respect to the perimeter portion of the fluid distribution member when the fluid distribution member is heated and to contract and rotate in an opposite direction when the fluid distribution member cools.

2. The fluid distribution member assembly of claim 1, wherein the fluid distribution member further comprises at least one through-hole.

3. The fluid distribution member assembly of claim 1, wherein the central portion comprises a plurality of through-holes or slots.

4. The fluid distribution member assembly of claim 1, wherein the central portion is an apertureless member.

5. The fluid distribution member assembly of claim 1, wherein the curved path spirals at a variable pitch.

6. The fluid distribution member assembly of claim 1, wherein the first slot has a variable width.

7. The fluid distribution member assembly of claim 1, wherein the fluid distribution member is substantially planar and of substantially constant thickness.

8. The fluid distribution member assembly of claim 1, wherein the fluid distribution member varies in thickness from the central portion to the perimeter portion.

9. The fluid distribution member assembly of claim 1, wherein the perimeter portion comprises at least one side wall orthogonal to the central portion defining an opening configured to direct plasma through the central portion.

10. The fluid distribution member assembly of claim 9, wherein the fluid distribution member is a dome or cup.

11. The fluid distribution member assembly of claim 1, wherein the fixed point is located at a fixed center point of the fluid distribution member.

12. The fluid distribution member assembly of claim 1, wherein
the fluid distribution member includes a second slot formed there-through between the central portion and the perimeter portion, and
the second slot defines a curved path having a shape that is similar to the curved path of the first slot.

13. The fluid distribution member assembly of claim 12, wherein the second slot is rotationally offset relative to the first slot.

14. The fluid distribution member assembly of claim 13, wherein at least a portion of the first slot passes between first and second portions of the second slot.

15. The fluid distribution member assembly of claim 1, wherein the fluid distribution member has a circular cross section and a fixed center point, and wherein the fixed point and the fixed center point are co-located.

16. A fluid distribution member assembly for a substrate processing system, comprising:
a fluid distribution member configured to (i) be arranged between a plasma generator assembly and a process chamber generator, separate from the plasma generator assembly, and (ii) receive plasma from the plasma generator assembly for distribution through the fluid distribution member into the process chamber; and
a first slot formed through the fluid distribution member and including one end and an opposite end,
wherein the first slot extends along a curved path that spirals relative to a fixed point on the fluid distribution member,
wherein the one end of the first slot is located closer to the fixed point than the opposite end,
wherein points along the first slot between the one end and the opposite end are located at an increasing radial distance from the fixed point,
wherein a length of the first slot is such that the first slot completely circumscribes the fixed point at least one time, and
wherein the curved path of the first slot allows for thermal expansion of the fluid distribution member such that the central portion of the fluid distribution member is configured to expand and rotate with respect to the perimeter portion of the fluid distribution member when the fluid distribution member is heated and to contract and rotate in an opposite direction when the fluid distribution member cools.

17. The fluid distribution member assembly of claim 16, wherein the fixed point is located at a fixed center point of the fluid distribution member.

18. The fluid distribution member assembly of claim 16, wherein:
the fluid distribution member includes a second slot formed there-through, and
the second slot defines a curved path having a shape that is similar to the curved path of the first slot.

19. The fluid distribution member assembly of claim 18, wherein the second slot is rotationally offset relative to the first slot.

20. The fluid distribution member assembly of claim 19, wherein at least a portion of the first slot passes between first and second portions of the second slot.

21. The fluid distribution member assembly of claim 16, wherein the fluid distribution member has a circular cross section and a fixed center point, and wherein the fixed point and the fixed center point are co-located.

22. The fluid distribution member assembly of claim 16, wherein the curved path spirals at a variable pitch.

* * * * *